(12) United States Patent
Yeh et al.

(10) Patent No.: US 9,825,013 B2
(45) Date of Patent: Nov. 21, 2017

(54) TRANSFER-BONDING METHOD FOR THE LIGHT EMITTING DEVICE AND LIGHT EMITTING DEVICE ARRAY

(71) Applicant: Industrial Technology Research Institute, Hsinchu (TW)

(72) Inventors: Wen-Yung Yeh, Hsinchu County (TW); Chia-Hsin Chao, Hsinchu County (TW); Ming-Hsien Wu, Tainan (TW); Kuang-Yu Tai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 28 days.

(21) Appl. No.: 14/970,548

(22) Filed: Dec. 16, 2015

(65) Prior Publication Data

US 2016/0104695 A1 Apr. 14, 2016

Related U.S. Application Data

(62) Division of application No. 13/557,231, filed on Jul. 25, 2012, now abandoned.
(Continued)

(30) Foreign Application Priority Data

May 25, 2012 (TW) .............................. 101118745 A

(51) Int. Cl.
| | | |
|---|---|---|
| *H01L 29/20* | (2006.01) | |
| *H01L 33/00* | (2010.01) | |
| *H01L 25/075* | (2006.01) | |
| *H01L 27/15* | (2006.01) | |
| *H01L 33/58* | (2010.01) | |
| *H01L 33/06* | (2010.01) | |
| *H01L 33/32* | (2010.01) | |
| *H01L 33/38* | (2010.01) | |
| *H01L 33/54* | (2010.01) | |

(Continued)

(52) U.S. Cl.
CPC ........ *H01L 25/0753* (2013.01); *H01L 27/156* (2013.01); *H01L 33/06* (2013.01); *H01L 33/32* (2013.01); *H01L 33/38* (2013.01); *H01L 33/54* (2013.01); *H01L 33/58* (2013.01); *H01L 33/62* (2013.01); *H01L 33/44* (2013.01); *H01L 2924/0002* (2013.01)

(58) Field of Classification Search
CPC .... H01L 25/0753; H01L 27/156; H01L 33/62
USPC ...................... 257/89, 99, E33.056, E33.066
See application file for complete search history.

(56) References Cited

U.S. PATENT DOCUMENTS

| 7,535,028 | B2 * | 5/2009 | Fan ........................ H01L 27/153 257/88 |
|---|---|---|---|
| 2004/0183089 | A1 * | 9/2004 | Udagawa ............ H01L 25/0753 257/103 |
| 2008/0224153 | A1 * | 9/2008 | Tomoda .............. H01L 21/6835 257/88 |

* cited by examiner

*Primary Examiner* — Robert Huber
(74) *Attorney, Agent, or Firm* — JCIPRNET

(57) ABSTRACT

A light emitting device array including a circuit substrate and a plurality of device layers is provided. The circuit substrate includes a plurality of bonding pads and a plurality of conductive bumps located over the bonding pads. The device layers are capable of emitting different colored lights electrically connected with the circuit substrate through the conductive bumps and the bonding pads. The device layers capable of emitting different colored lights have different thicknesses and the conductive bumps bonded with the device layers capable of emitting different colored lights have different heights such that top surfaces of the device layers capable of emitting different colored lights are located on a same level of height.

15 Claims, 19 Drawing Sheets

Related U.S. Application Data

(60) Provisional application No. 61/511,137, filed on Jul. 25, 2011.

(51) Int. Cl.
*H01L 33/62* (2010.01)
*H01L 33/44* (2010.01)

TRANSFER-BONDING METHOD FOR THE LIGHT EMITTING DEVICE AND LIGHT EMITTING DEVICE ARRAY

CROSS-REFERENCE TO RELATED APPLICATION

This application is a divisional application of and claims the priority benefit of U.S. application Ser. No. 13/557,231, filed on Jul. 25, 2012, now pending. The prior U.S. application claims the priority benefits of U.S. provisional application Ser. No. 61/511,137, filed on Jul. 25, 2011 and Taiwan application serial no. 101118745, filed on May 25, 2012. The entirety of each of the above-mentioned patent applications is hereby incorporated by reference herein and made a part of this specification.

TECHNICAL FIELD

The technical field relates to a manufacturing method for light emitting devices array, and also relates to a light emitting device array.

BACKGROUND

Inorganic light emitting diode display has features of self-luminous, high brightness and so on, and therefore has been widely applied in the fields of illumination, display and so forth monolithic micro-display has been constantly faced with a bottleneck of colorizing technology. A conventional technology utilizing an epitaxial technique in a single light emitting diode chip to manufacture a plurality of light emitting layers capable of emitting different colored lights has already been provided, such that the single light emitting diode chip can provide different colored lights. Because lattice constants of the light emitting layers capable of emitting different colored lights are different, growth of the light emitting layers on a same substrate is difficult. In addition, another conventional technology has provided a colorizing technique utilizing a light emitting diode chip in collocation with different color conversion materials, but this technology is still facing problems of low conversion efficiency of the color conversion materials, coating uniformity and so forth.

The transfer-bonding technique of the light emitting diode has a better chance to enhance brightness and display quality of a monolithic micro-display. Rapidly and efficiently transfer-bonding the light emitting diode to a circuit substrate of the monolithic micro-display is in fact one of the recently concerned issues of industry.

SUMMARY

One of exemplary embodiments provides a transfer-bonding method for light emitting devices and a light emitting device array.

One of exemplary embodiments provides a transfer-bonding method for light emitting devices including: a plurality of light emitting devices is formed over a first substrate and is arranged in array, wherein each of the light emitting devices includes a device layer and a sacrificial pattern sandwiched between the device layer and the first substrate; a protective layer is formed over the first substrate to selectively cover parts of the light emitting devices, and other parts of the light emitting devices are uncovered by the protective layer; the device layers uncovered by protective layer are bonded with a second substrate; and the sacrificial patterns uncovered by the protective layer are removed, so that parts of the device layers are separated from the first substrate and are transfer-bonded to the second substrate.

One of exemplary embodiments provides a light emitting device array including a circuit substrate and a plurality of device layers capable of emitting different colored lights, wherein the circuit substrate has a plurality of bonding pads and a plurality of conductive bumps over the bonding pads, the device layers capable of emitting different colored lights are electrically connected with the circuit substrate through the conductive bumps and the bonding pads. The device layers capable of emitting different colored lights have different thicknesses, and the conductive bumps bonded with the device layers capable of emitting different colored lights have different heights, such that top surfaces of the device layers capable of emitting different colored lights device layer are located on a same level of height.

One of exemplary embodiments provides a light emitting device array including a circuit substrate and a plurality of device layers capable of emitting different colored lights, wherein the circuit substrate has a plurality of bonding pads and a plurality of conductive bumps over the bonding pads, and the device layers capable of emitting different colored lights are electrically connected with the circuit substrate through the conductive bumps and the bonding pads. The device layers capable of emitting different colored lights have different thicknesses, and the conductive bumps bonded with the device layers capable of emitting different colored lights have different heights, such that top surfaces of the device layers capable of emitting different colored lights are located on a different level of heights.

An embodiment is able to rapidly and efficiently transfer-bond the light emitting devices from a substrate to another substrate so as to facilitate an application of the light emitting devices in the field of micro-display.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

First Embodiment

Figure 1A:
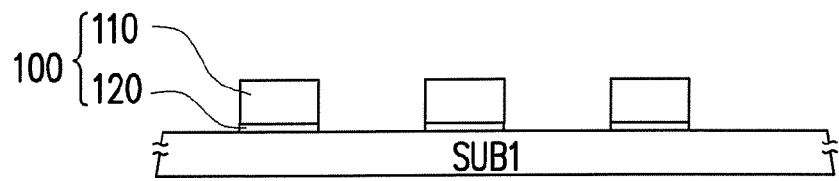
FIG. 1A to FIG. 1K are schematic flow chat diagrams illustrating a transfer-bonding method for light emitting devices according to a first embodiment.

FIG. 1A to FIG. 1K are schematic flow chat diagrams illustrating a transfer-bonding method for light emitting devices according to a first embodiment. Referring to FIG. 1A, a plurality of light emitting devices 100 is formed over a first substrate SUB1 and are arranged in array, wherein each of the light emitting devices 100 includes a device layer 110 and a sacrificial pattern 120 sandwiched between the device layer 110 and the first substrate SUB1. In present embodiment, the device layers 110 located over the same first substrate SUB1 are suitable for emitting same colored lights. For example, the device layers 110 formed over the first substrate SUB1 are red light emitting diodes, green light emitting diodes or blue light emitting diodes. In addition, every device layer 110 has already included an electrode (not shown).

Figure 1B:
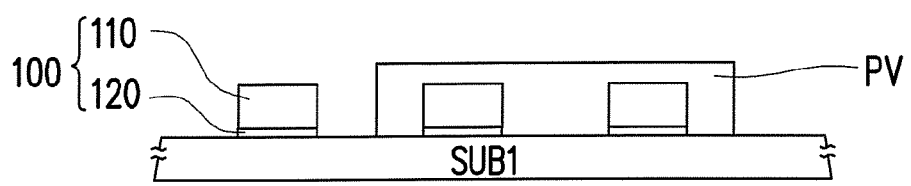

Referring to FIG. 1B, a protective layer PV is formed over the first substrate SUB1 to selectively cover parts of the light emitting devices 100, while other parts of the light emitting devices 100 are uncovered by the protective layer PV. In the present embodiment, the protective layer PV is, for example, a photoresist material or other dielectric material, such that the light emitting devices 100 covered by the protective layer PV, in a subsequent removal process of the sacrificial patterns 120, is not separated from the first substrate SUB1. For example, a material of the protective layer PV may be a polyimide or other polymer material, and the material of the protective layer PV may also be a silicon oxide (SiOx), a silicon nitride (SiNx) or other inorganic dielectric material.

Figure 1C:
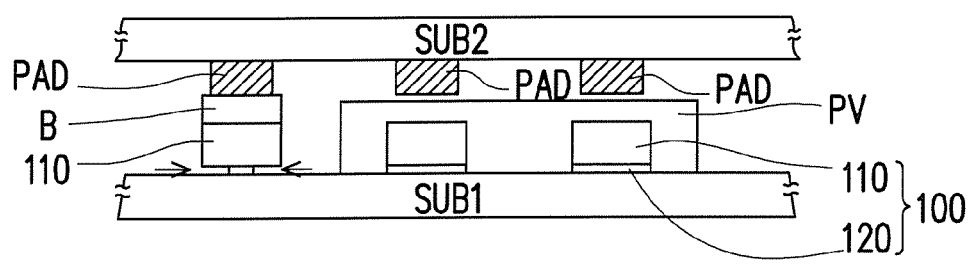
Figure 1D:
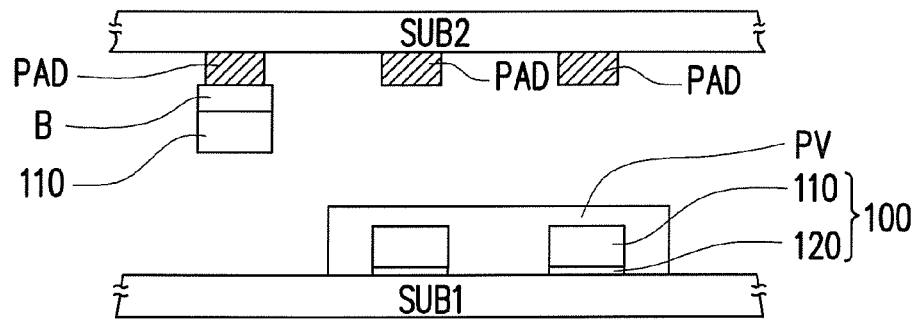

Referring to FIG. 1C and FIG. 1D, the device layers 110 uncovered by the protective layer PV are bonded with a second substrate SUB2, and the sacrificial patterns 120 (as shown in FIG. 1C) uncovered by the protective layer PV are removed, so that parts of the device layers 110 are separated from the first substrate SUB1 and are transfer-bonded to the second substrate SUB2 (as shown in FIG. 1D). In the present embodiment, the second substrate SUB2 is, for example, a circuit substrate (e.g., a complementary metal oxide semiconductor chip having a plurality of bonding pads PAD) in a monolithic micro-display, and the device layers 110 uncovered by the protective layer PV are bonded with the bonding pads PAD over the second substrate SUB2 through the conductive bumps B. For example, the conductive bumps B are gold bumps or other alloy bumps, and the bonding (electrical connection) between the conductive bumps B and the bonding pads PAD over the second substrate SUB2 are achieved through reflow or other soldering process.

As shown in FIG. 1C, during a process of bonding the conductive bumps B and the bonding pads PAD, the protective layer PV is able to effectively and directly control a distance between the first substrate SUB1 and the second substrate SUB2, so as to avoid a phenomena of excessive press fit. In other words, the protective layer PV provides a function of bonding stop and thus a process control is much easier.

In the present embodiment, the removal process of the sacrificial pattern is, for example, wet etch. A choice of etchant is related to the material of the protective layer PV, an etching rate of the chosen etchant on the sacrificial pattern 120 has to be higher than an etching rate on the protective layer PV, so as to ensure the device layers 110 and the sacrificial patterns 120 covered by the protective layer PV are not to be damaged by the etchant.

FIG. 1A to FIG. 1D have briefly illustrated a process of transfer-bonding the light emitting devices 100 from the first substrate SUB1 to the second substrate SUB2. In order to transfer-bond a plurality of device layers suitable for emitting different colored lights to the second substrate SUB2, the present embodiment is able to selectively perform the manufacturing process steps illustrated in FIG. 1E to FIG. 1K.

Figure 1E:
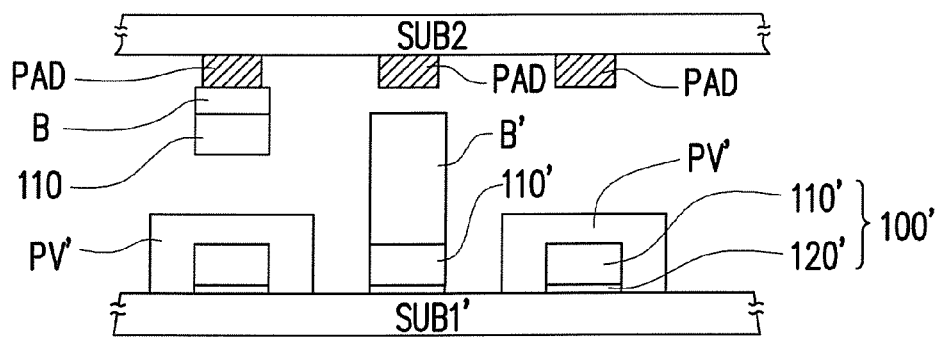

Referring to FIG. 1E, a plurality of light emitting devices arranged in array 100' are formed over another first substrate SUB1', wherein each of the light emitting device 100' includes a device layer 110' and a sacrificial pattern 120' sandwiched between the device layer 110' and the first substrate SUB1'. In the present embodiment, device layers 110' located over the first substrate SUB1' are suitable for emitting same colored lights. For example, the device layers 110' over the first substrate SUB1' all are red light emitting diodes, green light emitting diodes or blue light emitting diodes. The device layer 110' and the device layers 110 are suitable for respectively emitting different colors of light.

As shown in FIG. 1E, a protective layer PV' is formed over the first substrate SUB1' to selectively cover parts of the light emitting devices 100', while other parts of the light emitting devices 100' are uncovered by the protective layer PV'. The protective layer PV' in FIG. 1E has the same function as the protective layer PV in FIG. 1B, and thus is not repeated herein.

Figure 1F:
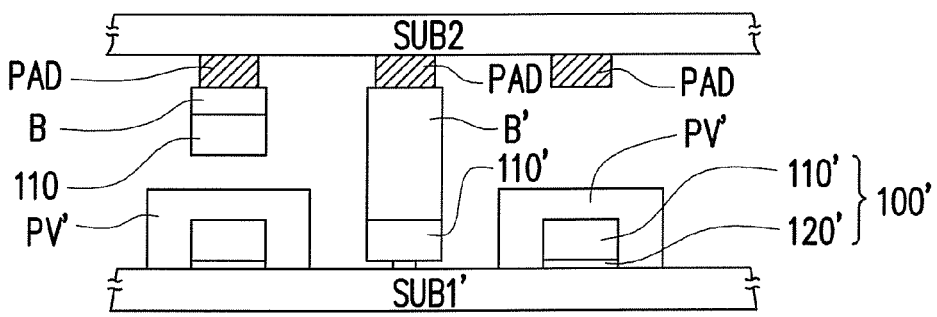
Figure 1G:
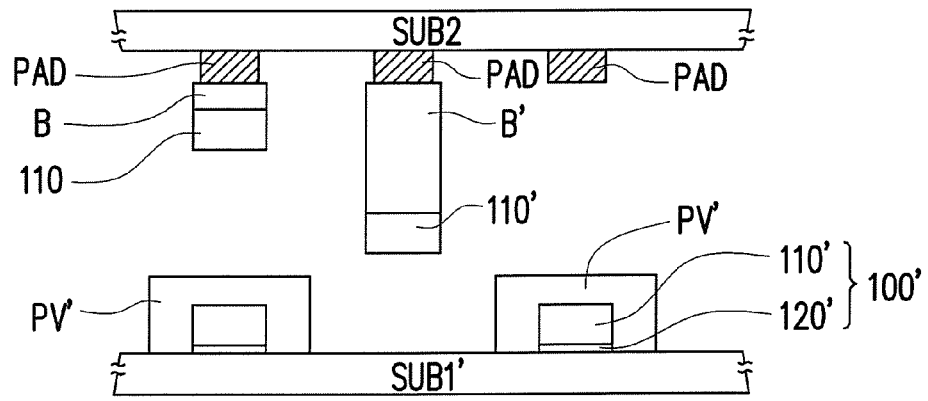

Referring to FIG. 1F and FIG. 1G, the device layers 110' uncovered the by protective layer PV' are bonded with a second substrate SUB2, and the sacrificial patterns 120' (as shown in FIG. 1F) uncovered by the protective layer PV' are removed, so that parts of the device layers 110' are separated from the first substrate SUB1' and are transfer-bonded to the second substrate SUB2 (as shown in FIG. 1G). In the present embodiment, the device layers 110' uncovered by the protective layer PV' is, for example, bonded with a plurality of bonding pads PAD over the second substrate SUB2 through a plurality of conductive bumps B'. For example, the conductive bumps B' are gold bumps or other alloy bumps, and the bonding (electrical connection) between the conductive bumps B' and the bonding pads PAD over the second substrate SUB2 are achieved through reflow or other soldering process.

Figure 1H:
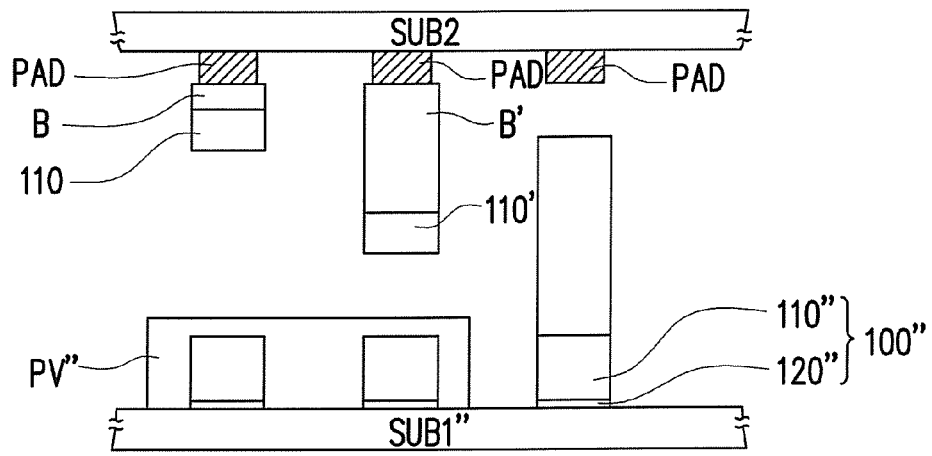

Referring to FIG. 1H, a plurality of light emitting devices arranged in array 100" is formed over another first substrate SUB1", wherein each of the light emitting devices 100" includes a device layer 110" and a sacrificial pattern 120" sandwichted between the device layer 110" and the first substrate SUB1". In the present embodiment, the device layers 110" located over the same first substrate SUB1" are suitable for emitting same colored lights. For example, the device layer 110" over the first substrate SUB1" all are red light emitting diodes, green light emitting diodes or blue light emitting diodes. The device layers 110", the device layers 110' and the device layers 110 are suitable for respectively emitting different colors of light.

As shown in FIG. 1H, a protective layer PV" is formed on the first substrate SUB1" to selectively cover parts of the light emitting devices 100", while other parts of the light emitting devices 100" are uncovered by the protective layer PV". The protective layer PV" in FIG. 1E is has the same function as the protective layer PV in FIG. 1B, and thus is not repeated herein.

Figure 1I:
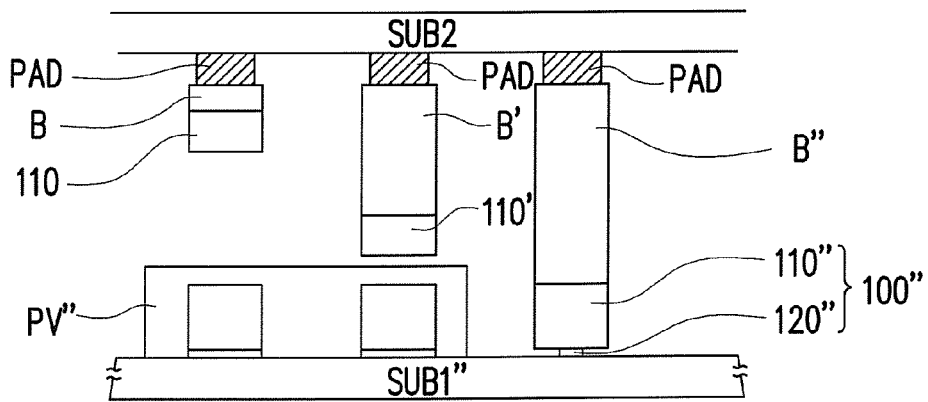

Referring to FIG. 1I, the device layers 110" uncovered by the protective layer PV" are bonded with a second substrate SUB2, and the sacrificial patterns 120" uncovered by the protective layer PV" are removed, so that parts of the device layers 110" are separated from the first substrate SUB1" and are transfer-bonded to the second substrate SUB2 (as shown in FIG. 1G). In the present embodiment, the device layer 110" uncovered by the protective layer PV" are, for example, bonded with a plurality of bonding pads PAD over the second substrate SUB2 through a plurality of conductive bumps B". For example, the conductive bumps B" are gold bumps or other alloy bumps, and the bonding between the conductive bumps B" and the bonding pads PAD over the second substrate SUB2 is achieved through reflow or other soldering process.

As shown in FIG. 1A to FIG. 1I, the device layers 110, the device layers 110' and the device layers 110" are transfer-bonded to the second substrate SUB2. In detail, a total thickness of the device layers 110 and the conductive bumps B is smaller than a total thickness of the device layers 110' and the conductive bumps B', and the total thickness of the device layers 110' and the conductive bumps B' is smaller than a total thickness of the device layers 110" and the conductive bumps B". When the total thickness of the device layers 110 and the conductive bumps B is smaller than the total thickness of the device layers 110' and the conductive bumps B', the device layers 110" during the process of transfer-bonding to the second substrate SUB2 are not to be interfered by the device layers 110. When the total thickness of the device layers 110' and the conductive bumps B' is smaller than the total thickness of the device layer 110" and the conductive bumps B", the device layers 110'" during the transfer-bonding process to the second substrate SUB2 are not to be interfered by the device layers 110'.

Figure 1J:
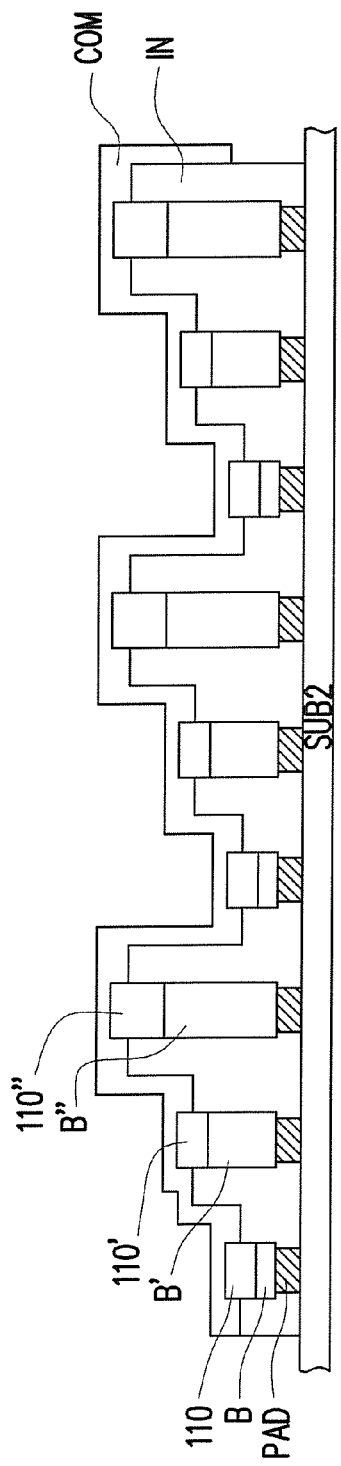

Referring to FIG. 1J, in order to prevent abnormal short-circuit between the device layers 110, 110', 110", the present embodiment firstly form an insulating layer IN over the second substrate SUB2 to fill in between the device layers 110, 110', 110", and then a common electrode COM is formed on the device layers 110, 110', 110" and the insulating layer IN.

Figure 1K:
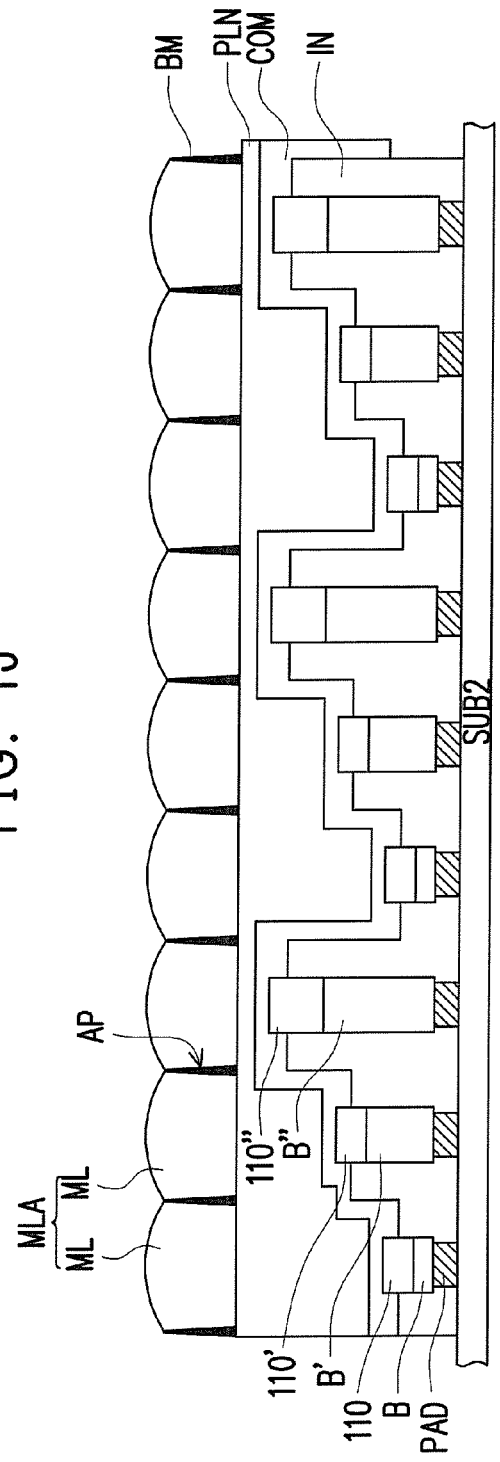

Referring to FIG. 1K, since the device layers 110, 110', 110" capable of emitting different colored lights are different in thicknesses, and the conductive bumps B, B', B" have different heights, top surfaces of the device layers 110, 110', 110" capable of emitting different colored lights are located on different level of heights.

The present embodiment is able to form a planarized layer PLN on the common electrode COM, and after the manufacturing of the planarized layer PLN is completed, the present embodiment is able to selectively form a black matrix BM and/or a micro-lens array MLA on the planarized layer PLN. For example, the black matrix BM has a plurality of openings AP, and each of the openings AP is respectively located above at least one of the device layers 110, 110', 110". In addition, the micro-lens array MLA includes a plurality of micro-lenses ML arranged in array, and each of the micro-lenses ML is respectively located above at least one of the device layers 110, 110', 110". Each of the micro-lenses ML is respectively located the openings AP therein, and is corresponded to at least one of the device layers 110, 110', 110".

Since the present embodiment adopts a coordination of the sacrificial patterns 120, 120', 120", the protective layers PV, PV', PV" and the conductive bumps B, B', B", the present embodiment is able to very efficiently transfer-bond the different device layers 110, 110', 110" to the second substrate SUB2.

Figure 2:
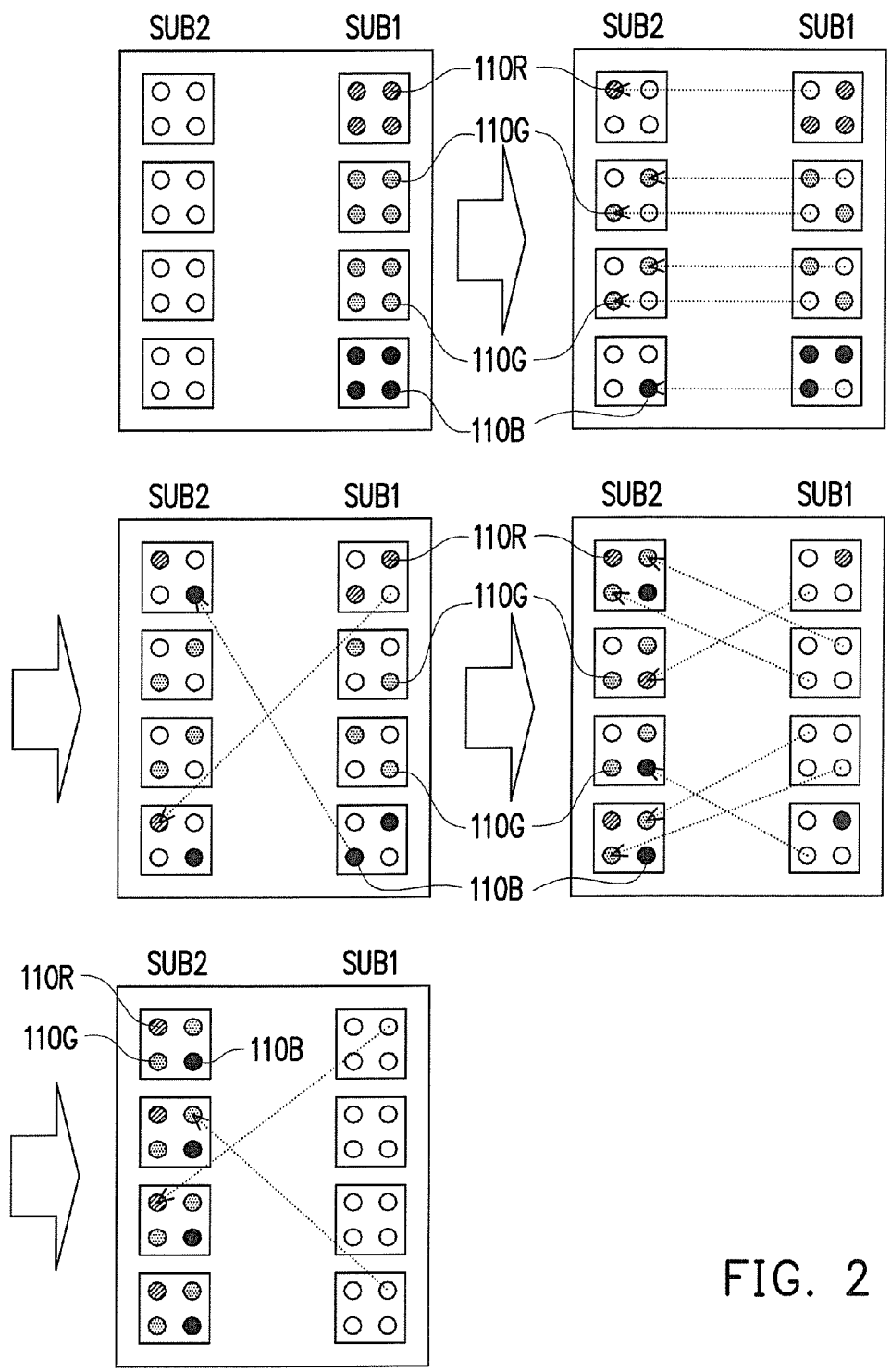
FIG. 2, FIG. 3 and FIG. 4 illustrate bonding sequences of the light emitting devices and a second substrate.
Figure 3:
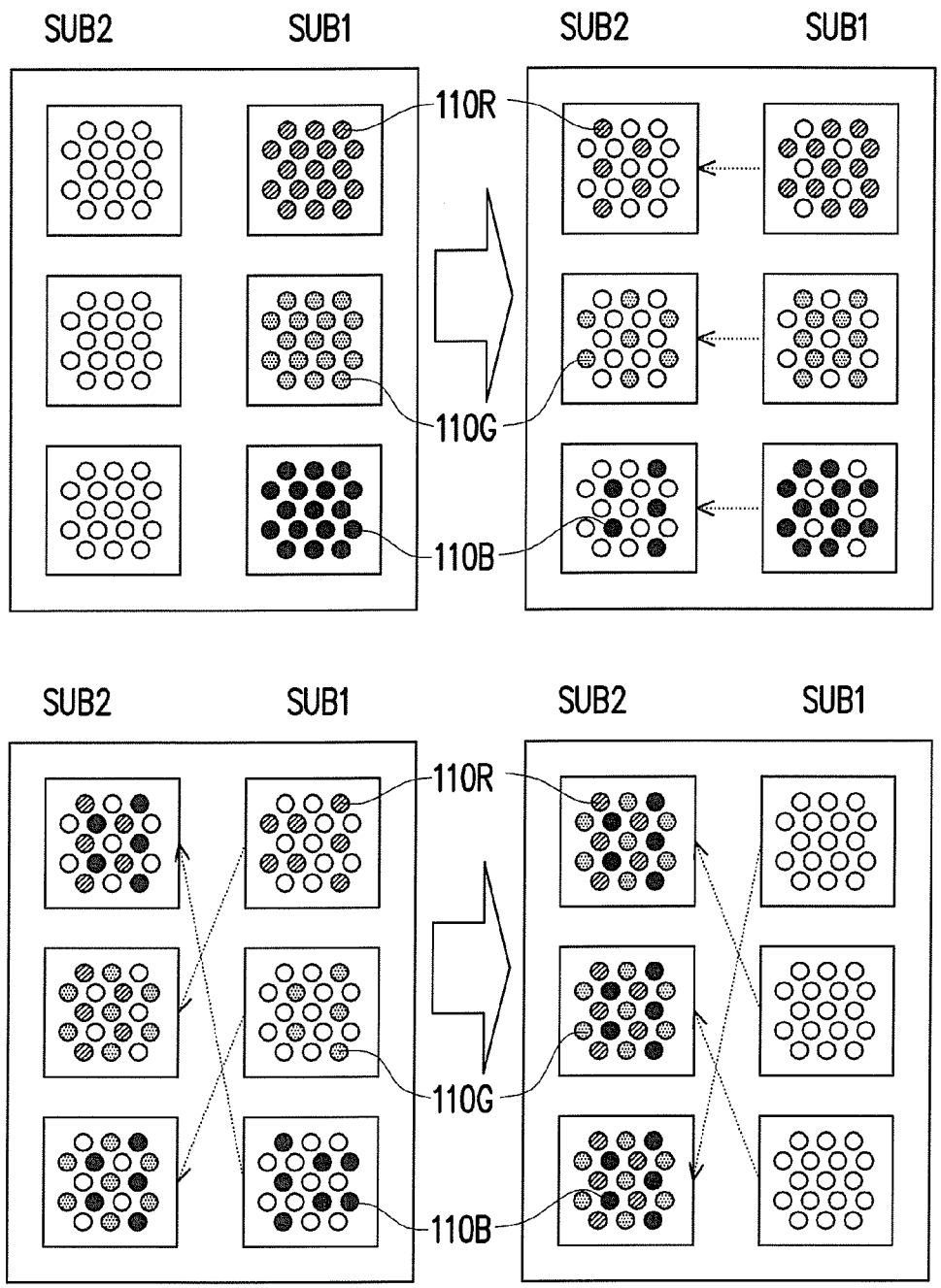
Figure 4:
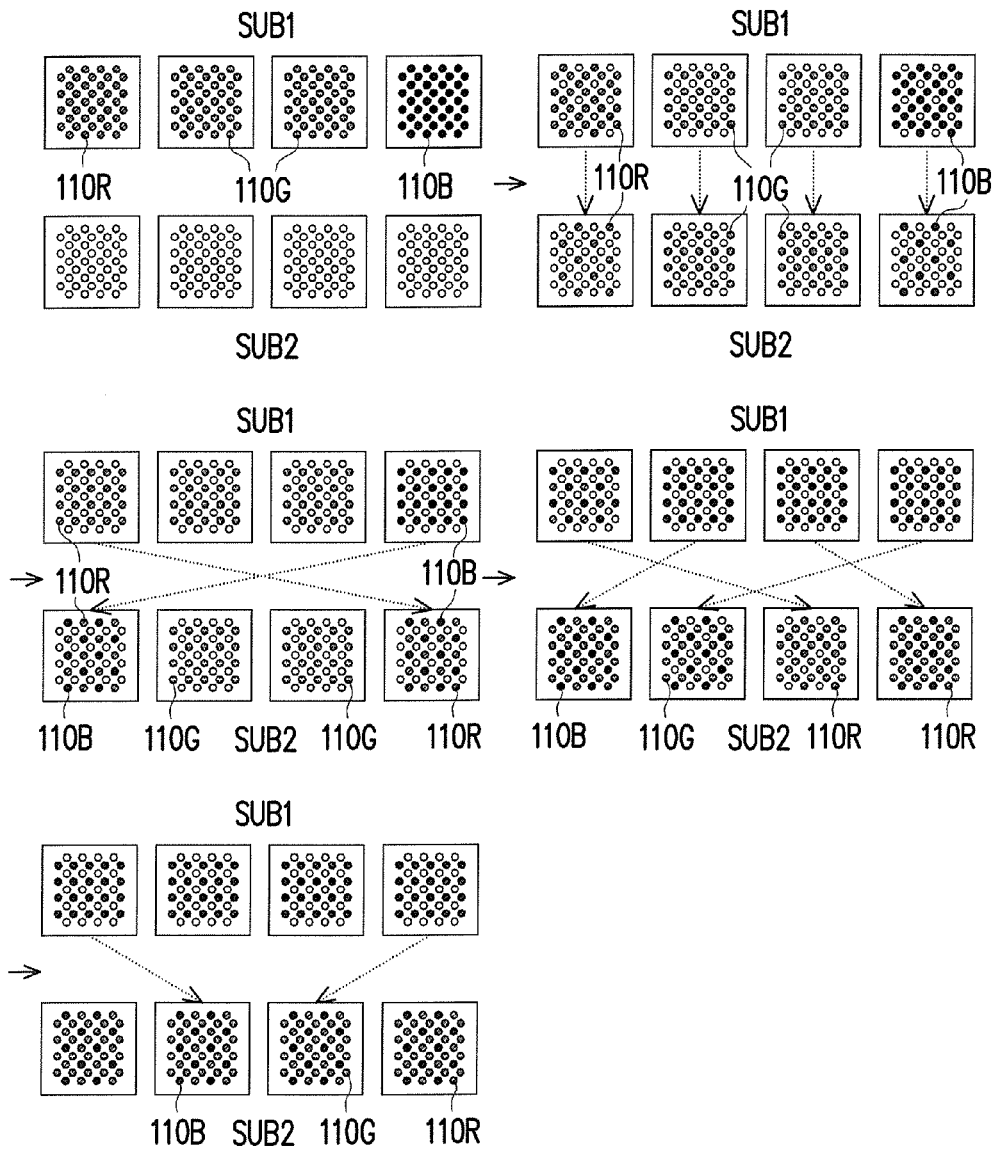

In order to transfer-bond the light emitting devices capable of emitting different colored lights to a same second substrate SUB2, the present embodiment provides the bonding sequences illustrated in FIG. 2, FIG. 3 and FIG. 4. With the bonding sequences illustrated in FIG. 2, FIG. 3 and FIG. 4, all of the light emitting devices may be smoothly transfer-bonded to the second substrate SUB2 without a problem of still remaining parts of the light emitting device over the first substrate SUB1 (or the first substrate SUB1', SUB1").

As shown in FIG. 2 to FIG. 4, firstly, three first substrates SUB1 (as shown in FIG. 3) or four first substrates SUB1 (as shown in FIG. 2 or FIG. 4) are provided, wherein one of the first substrates SUB has red light emitting devices 110R. In addition, one of the first substrates SUB1 has blue light emitting devices 110B, and the rest of the first substrates SUB1 have green light emitting devices 110G. Next, the red light emitting devices 110R, the green light emitting devices 110G and the blue light emitting devices 110B on the first substrates SUB1 are transfer-bonded to predetermined positions on the second substrates SUB2 (as shown in accordance with the dotted lines). Hence, the red light emitting devices 110R, the green light emitting devices 110G and the blue light emitting devices 110B may be rapidly and efficiently transfer-bonded from the first substrates SUB1 to the second substrates SUB2 without the problem of still remaining parts of the light emitting device over the first substrate SUB1.

Methods for Manufacturing Sacrificial Patterns

Figure 5A:
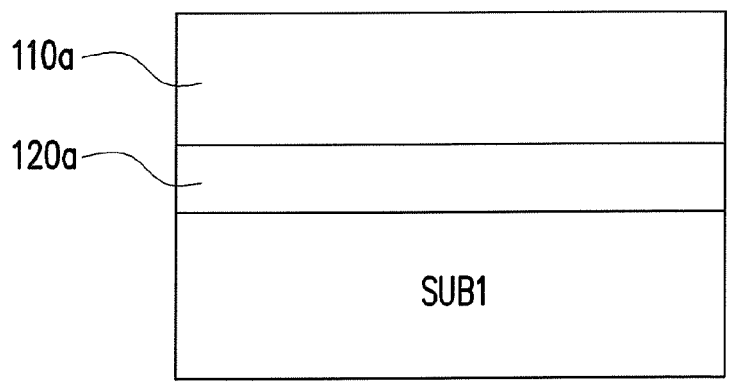
FIG. 5A to FIG. 5C illustrate a method for manufacturing sacrificial patterns.
Figure 5B:
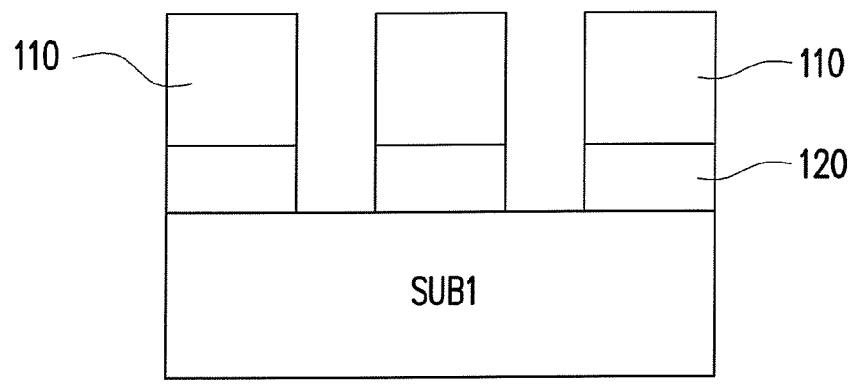
Figure 5C:
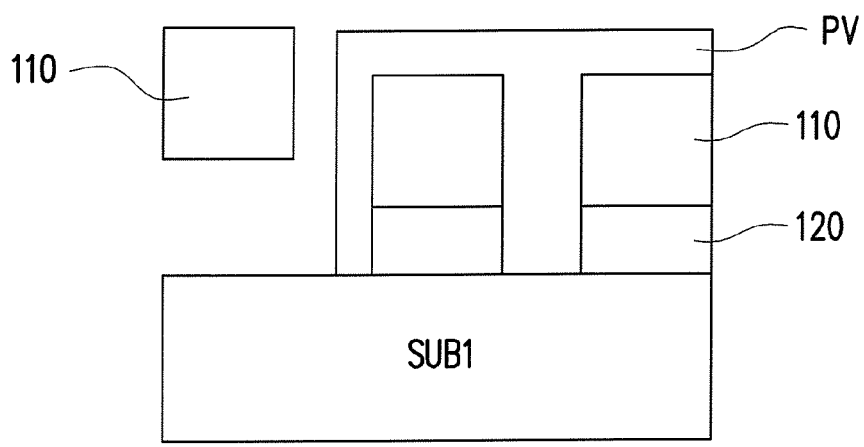

FIG. 5A to FIG. 5C illustrate a method for manufacturing sacrificial patterns. Referring to FIG. 5A, a sacrificial layer 120a and a semiconductor epitaxial layer 110a are formed on the first substrate SUB1, wherein the first substrate SUB1 is, for example, a sapphire substrate, and the sacrificial layer 120a is, for example, a zinc oxide (ZnO) epitaxial layer, a AlGaN epitaxial layer, a AlInN epitaxial layer, or so forth formed by an epitaxial process.

Referring to FIG. 5B, the semiconductor epitaxial layer 110a and the sacrificial layer 120a are patterned in order to form a plurality of device layers 110 and a plurality of sacrificial patterns 120 sandwiched between the device layers 110 and the first substrate SUB1. In the present embodiment, a process of patterning the semiconductor epitaxial layer 110a and the sacrificial layer 120a is, for example, a photolithography and etching process.

Referring to FIG. 5C, when parts of the device layers 110 are covered by the protective layer PV, the sacrificial patterns 120 uncovered by the protective layer PV may be removed by the etchant, such that the device layers 110 uncovered by the protective layer PV are separated from the first substrate SUB1. When a material of the sacrificial patterns 120 is zinc oxide, an etchant to be used includes a phosphoric acid ($H_3PO_4$), a hydrochloric acid (HCl) or other acidic solution. When a material of the sacrificial patterns 120b is AlGaN or AlInN, an etchant to be used includes a potassium hydroxide (KOH), a nitric acid ($HNO_3$) or other solution.

Figure 6A:
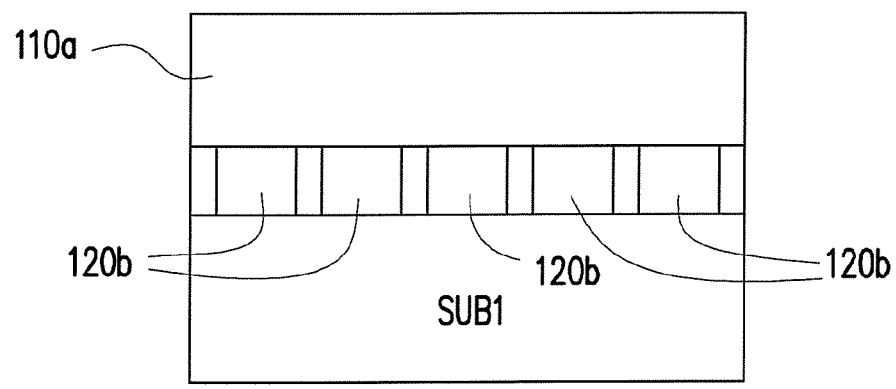
FIG. 6A to FIG. 6C illustrate another method for manufacturing sacrificial patterns.
Figure 6B:
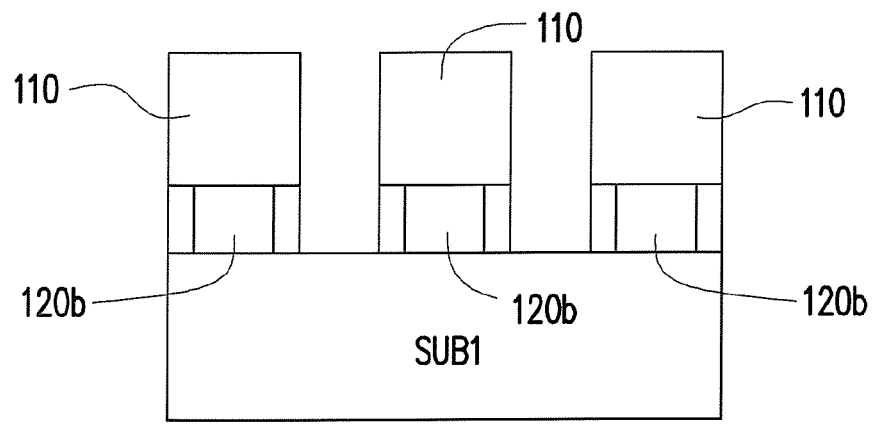
Figure 6C:
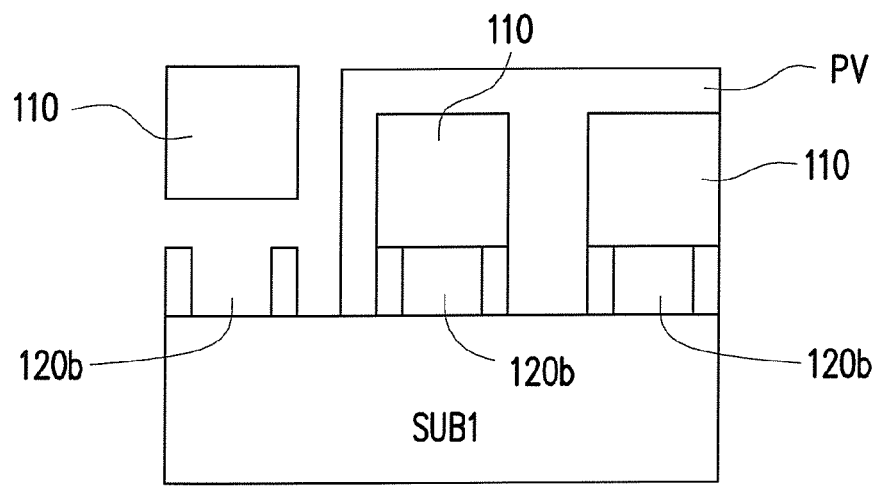

FIG. 6A to FIG. 6C illustrate another method for manufacturing sacrificial patterns. Referring to FIG. 6A, a patterned sacrificial layer 120b is firstly formed on the first substrate SUB1, and then a semiconductor epitaxial layer 110a is formed on the patterned sacrificial layer 120b and the first substrate SUB1, wherein the first substrate SUB1 is, for example, a sapphire substrate, and the patterned sacrificial layer 120b is, for example, a zinc oxide (ZnO) epitaxial layer, a AlGaN epitaxial layer, a AlInN epitaxial layer, or so forth formed through the epitaxial process.

Referring to FIG. 6B, the semiconductor epitaxial layer 110a is patterned in order to form a plurality of device layers 110 and a plurality of sacrificial patterns or sacrificial islands 120b embedded between the device layers 110 and the first substrate SUB1. In the present embodiment, the process of patterning the semiconductor epitaxial layer 110a is, for example, the photolithography and etching process.

Figure 7A:
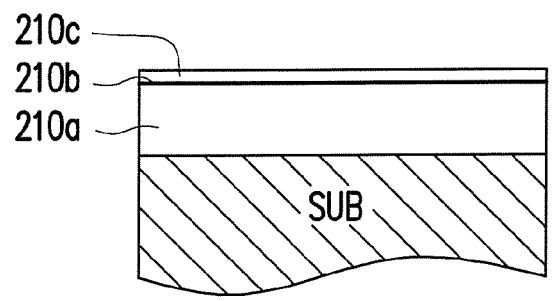
FIG. 7A to FIG. 7K are schematic flow chat diagrams illustrating a transfer-bonding method for light emitting devices according to a second embodiment.

Referring to FIG. 6C, when parts of the device layers 110 are covered by the protective layer PV, the sacrificial patterns 120b uncovered by the protective layer PV may be removed by the etchant, so that the device layers 110 uncovered by the protective layer PV can be easily separated from the first substrate SUB1. When a material of the sacrificial patterns 120b is zinc oxide, an etchant to be used includes a phosphoric acid ($H_3PO_4$), a hydrochloric acid (HCl) or other acidic solution. When a material of the sacrificial patterns 120b is AlGaN or AlInN, an etchant to be used includes a potassium hydroxide (KOH), a nitric acid ($HNO_3$) or other solution Second Embodiment FIG. 7A to FIG. 7K are schematic flow chat diagrams illustrating a transfer-bonding method for light emitting devices according to a second embodiment. Referring to FIG. 7A, firstly, a first type doped semiconductor layer 210a, a light emitting layer 210b and a second type doped semiconductor layer 210c are formed on a growth substrate SUB. In the present embodiment, the first type doped semiconductor layer 210a is, for example, a N-type doped GaN epitaxial layer formed through the epitaxial process, the light emitting layer 210b is, for example, a single or multiple quantum well light emitting layer formed through the epitaxial process, and the second type doped semiconductor layer 210c is, for example, a P-type doped GaN epitaxial layer formed through the epitaxial process. One of ordinary skilled in the art, at this point, would be able to manufacture a photonic crystal, a resonant cavity, an ohmic contact layer, and other related components based on actual design requirements, and thus no detail descriptions are elaborated in the present embodiment.

Figure 7B:
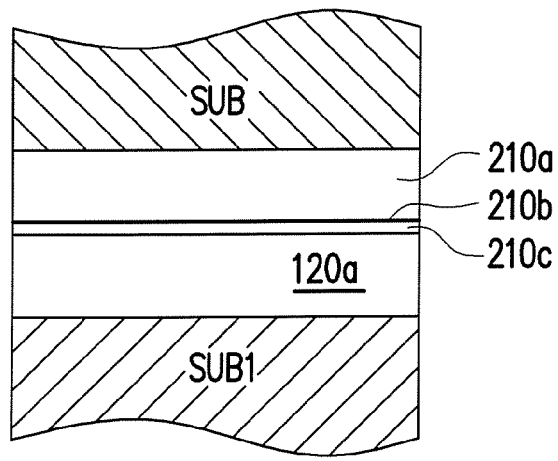

Referring to FIG. 7B, a sacrificial layer 120a is formed on a first substrate SUB1, and the second type doped semiconductor layer 210c is temporarily bonded with the sacrificial layer 120a.

Figure 7C:
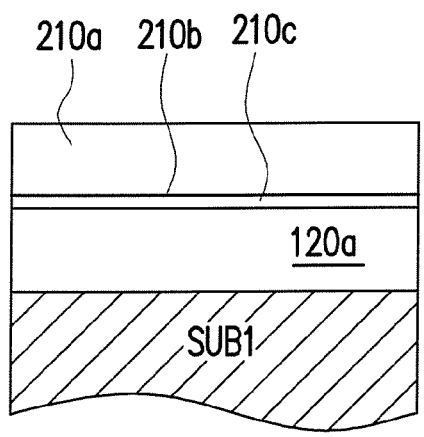

Referring to FIG. 7C, the first type doped semiconductor layer 210a and the growth substrate SUB are separated. In the present embodiment, a process of separating the first type doped semiconductor layer 210a and the growth substrate SUB includes a laser lift-off technique. In addition, one of ordinary skill in the art, after the first type doped semiconductor layer 210a and the growth substrate SUB are separated, may selectively perform a thinning process of first type doped semiconductor layer 210a (e.g., grinding or back etching), or to manufacture the photonic crystal on the first type doped semiconductor layer 210a.

Figure 7D:
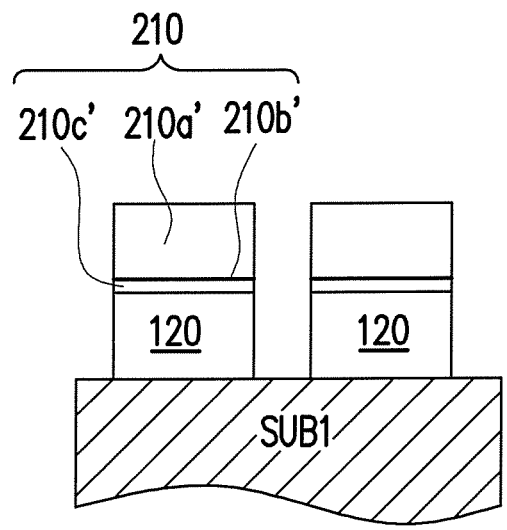

Referring to FIG. 7D, after the first type doped semiconductor layer 210a and the growth substrate SUB are separated, the first type semiconductor layer 210a, the light emitting layer 210b, the second type semiconductor layer 210c, and the sacrificial layer 120a are patterned in order to form a plurality of first type semiconductor patterns 210a', a plurality of light-emitting patterns 210b', a plurality of second type semiconductor patterns 210c' and the sacrificial patterns 120.

Figure 7E:
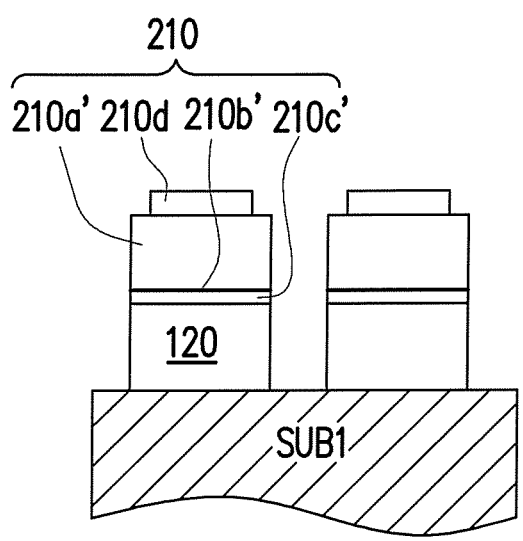

Referring to FIG. 7E, a plurality of electrodes 210d are formed over the first type semiconductor patterns 210a', wherein the first type semiconductor patterns 210a', the light-emitting patterns 210b', the second type semiconductor patterns 210c', and the electrodes 210d located on a same sacrificial pattern 120 constitute a device layer 210.

Figure 7F:
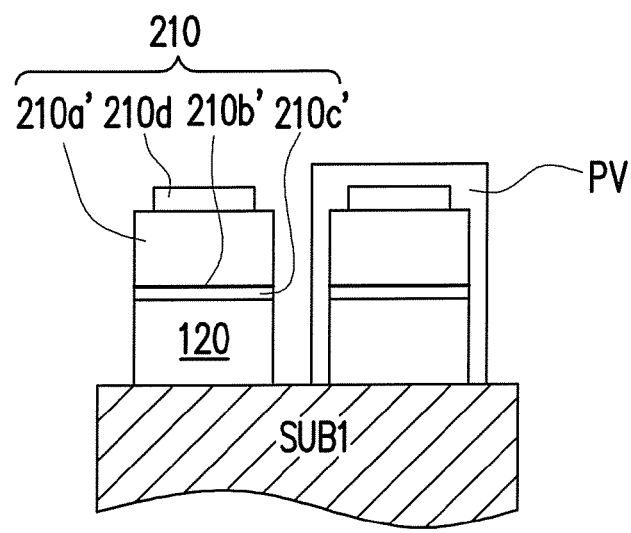

Referring to FIG. 7F, a protective layer PV is formed over the first substrate SUB1 to selectively cover parts of the device layers 210 and the sacrificial patterns 120, wherein parts of the device layers 210 and the sacrificial patterns 120 are uncovered by the protective layer PV. In the present embodiment, the protective layer PV is, for example, a photoresist material or other dielectric material, so as to ensure the device layers 210 covered by the protective layer PV are not to be separated from the first substrate SUB1 during a subsequent removal process of the sacrificial patterns 120. For example, a material of the protective layer PV may be a polyimide or other polymer material, and the material of the protective layer PV may also be a silicon oxide (SiOx), a silicon nitride (SiNx) or other inorganic dielectric material.

Figure 7G:
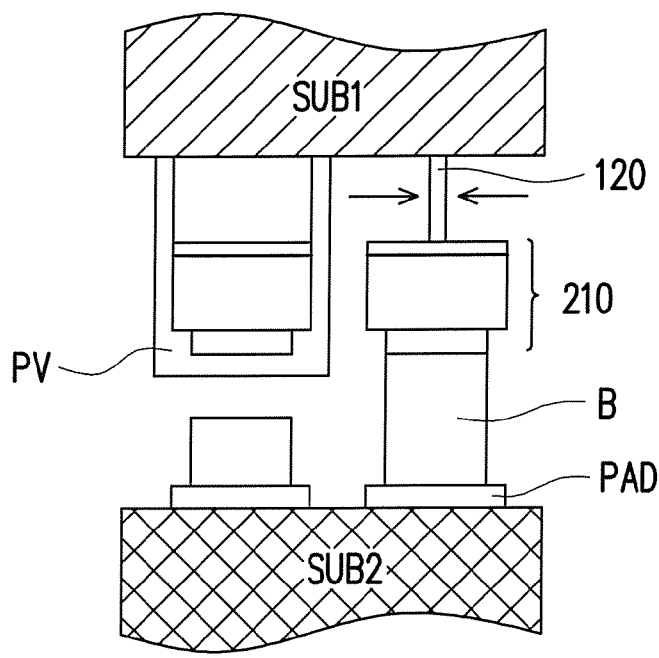

Referring to FIG. 7G, a second substrate SUB2 is provided, and the second substrate SUB2 is, for example, a circuit substrate (e.g., a complementary metal oxide semiconductor chip having a plurality of bonding pads PAD) in a monolithic micro-display. Next, the device layers 210 uncovered by the protective layer PV are bonded with the second substrate SUB2, and the sacrificial patterns 120 uncovered by the protective layer PV are removed, so that parts of the device layers 110 are separated from the first substrate SUB1 and are transfer-bonded to the second substrate SUB2. The device layer 210 uncovered by the protective layer PV are, for example, bonded the bonding pads PAD over the second substrate SUB2 through the conductive bumps B. For example, the conductive bumps B are gold bumps or other alloy bumps, and the bonding (electrical connection) between the conductive bumps B and the bonding pads PAD over the second substrate SUB2 are achieved through reflow or other soldering process.

As shown in FIG. 7G, during a process of bonding the conductive bumps B and the bonding pads PAD, the protective layer PV is able to control a distance between the first substrate SUB1 and the second substrate SUB2, so as to avoid a phenomenon of excessive press fit. In other words, the protective layer PV provides a function of bonding stop and thus a process control is easier.

Figure 7H:
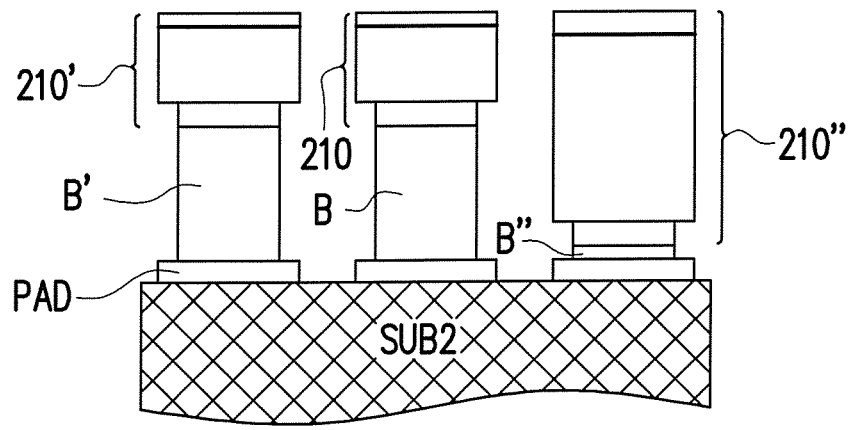

Referring to FIG. 7H, after the device layers 210 are transfer-bonded to the second substrate SUB2, one of ordinary skill in the art may selectively repeat the aforementioned steps illustrated in FIG. 7A to FIG. 7G for at least once, so as to transfer-bond the device layers 210' and the device layers 210" to the second substrate SUB2. Since the device layers 210, 210', 210" can emit different colored lights (e.g., a combination of red light, blue light, green light), the device layers 210, 210', 210" over the second substrate SUB2 can provide a function of full-color display.

As shown in FIG. 7H, since the device layers 210, 210', 210" capable of emitting different colored lights have different thicknesses, and the conductive bumps B, B', B" bonded with the device layers 210, 210', 210" also have different heights, top surfaces of the device layers 210, 210', 210" can be located on a same level of height. However, the present embodiment does not limit the top surfaces of the device layers 210, 210', 210" must be located on a same level of height, such that through adjusting the heights of the conductive bumps B, B', B", the top surfaces of the device layers 210, 210', 210" may be respectively located on different level of heights.

Figure 7I:
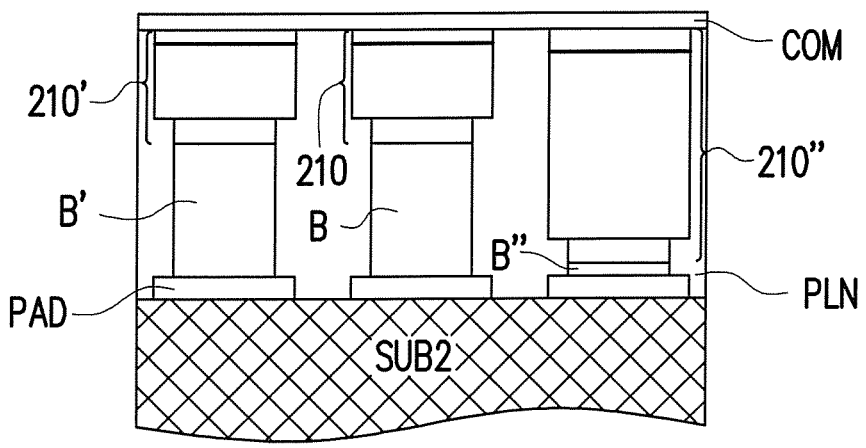
Figure 7J:
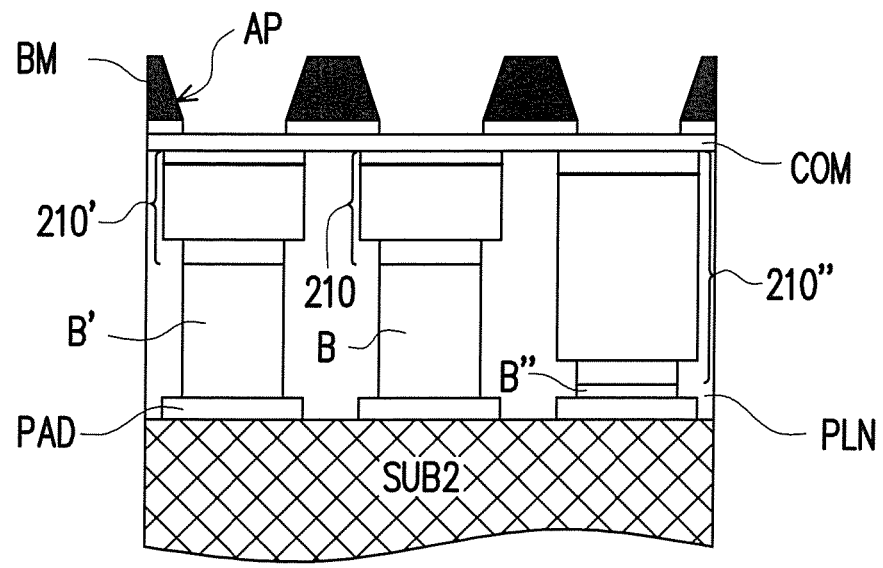

Referring to FIG. 7I and FIG. 7J, after the device layers 210, 210', 210" are all bonded with the second substrate SUB2, a planar insulating layer PLN' (as shown in FIG. 7I) are formed in between the device layers 210, 210', 210" over the second substrate SUB2, and then a common electrode COM is formed on the device layers 210, 210', 210" and the planar insulating layer PLN'. A black matrix BM is further formed on the common electrode COM, wherein the black matrix BM has a plurality of openings AP, and each of the openings AP is respectively located above one of the device layers 210, 210', 210". In the present embodiment, the black matrix BM may selectively be a good conductive shading material. Since the black matrix BM is disposed on the common electrode COM, the black matrix BM is able to further reduce a resistance of the common electrode COM in order to further enhance light emitting efficiencies of the device layers 210, 210', 210".

Figure 7K:
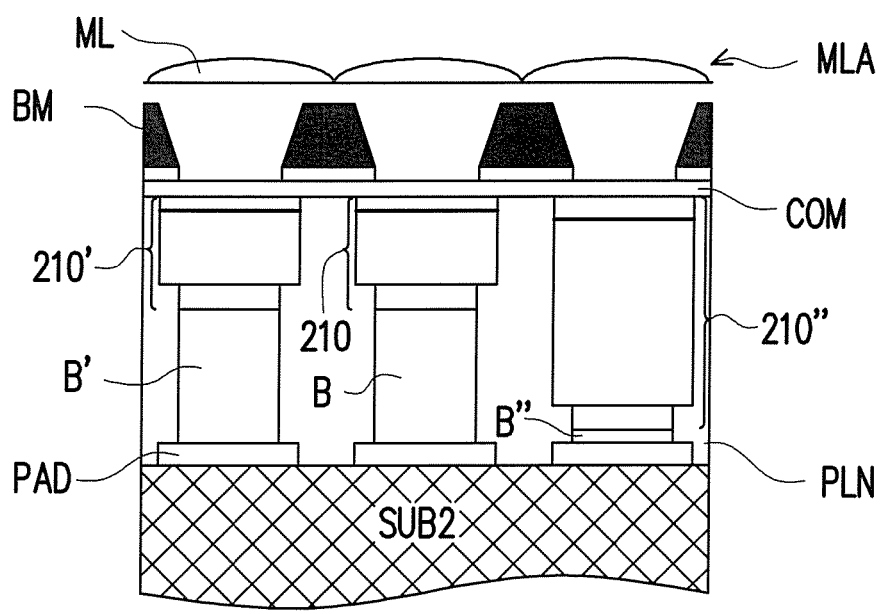

Referring to FIG. 7K, in order to further optimize optical performances of the device layers 210, 210', 210", the present embodiment is able to selectively form a micro-lens array MLA above the device layers 210, 210', 210", wherein the micro-lens array MLA includes a plurality of micro-lenses ML arranged in array, and each of the micro-lenses ML is respectively located above at least one of the device layers 210, 210', 210".

Third Embodiment

FIG. 8A to FIG. 8K are schematic flow chat diagrams illustrating a transfer-bonding method for light emitting devices according to a third embodiment. The transfer-bonding method for light emitting devices of the present embodiment is similar to the transfer-bonding method for light emitting devices of the second embodiment, except for main differences illustrated in FIG. 8B to FIG. 8H. , the following is to provide detail descriptions in coordination with FIG. 8A to FIG. 8K.

Figure 8A:
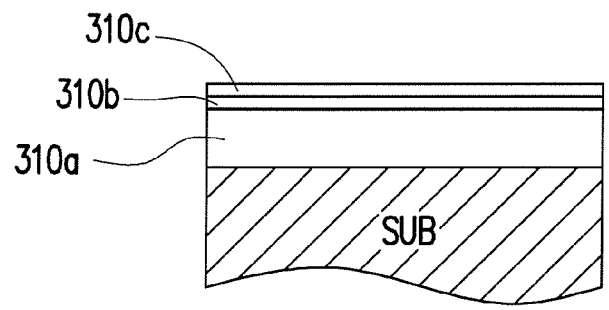
FIG. 8A to FIG. 8K are schematic flow chat diagrams illustrating a transfer-bonding method for light emitting devices according to a third embodiment.

Referring to FIG. 8A, firstly, a first type doped semiconductor layer 310a, a light emitting layer 310b and a second type doped semiconductor layer 310c are formed on a growth substrate SUB. In the present embodiment, the first type doped semiconductor layer 310a is, for example, a N-type doped GaN epitaxial layer formed by an epitaxial process, the light emitting layer 310b is, for example, a single or multiple quantum well light emitting layers formed through the epitaxial process, and the second type doped semiconductor layer 310c is, for example, a P-type doped GaN epitaxial layer formed through the epitaxial process. One of ordinary skill in the art would be able to manufacture a photonic crystal based on actual design requirements, and no detail descriptions are elaborated in the present embodiment.

Figure 8B:
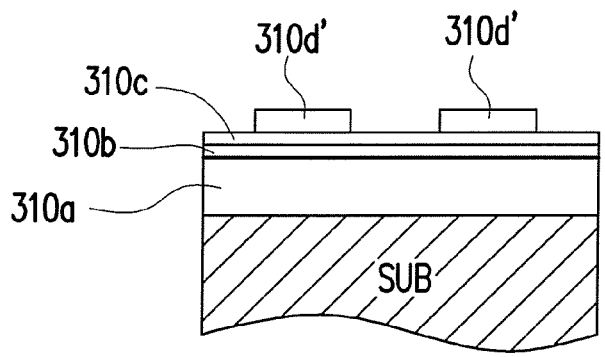

Referring to FIG. 8B, a plurality of electrodes 310d' are formed over the second type doped semiconductor layer 310c, wherein the electrodes 310d' and the second type doped semiconductor layer 310c have a ohmic contact in between.

Figure 8C:
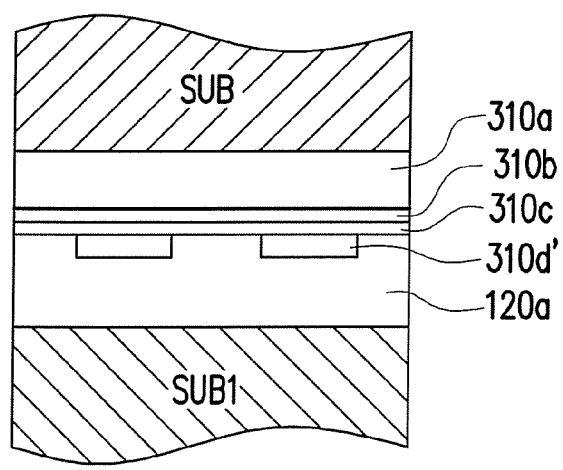

Referring to FIG. 8C, a sacrificial layer 120a is formed on the first substrate SUB1, so that the second type doped semiconductor layer 310c is temporarily bonded with the sacrificial layer 120a.

Figure 8D:
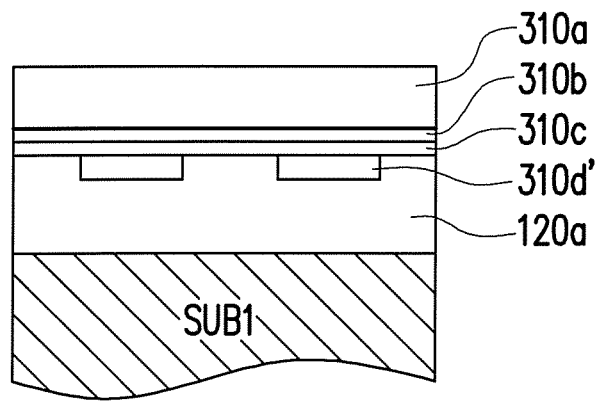

Referring to FIG. 8D, the first type doped semiconductor layer 310a are separated from the growth substrate SUB. In the present embodiment, a process of separating the first type doped semiconductor layer 310a and the growth substrate SUB includes a laser lift-off technique. In addition, one of ordinary skill in the art, after the first type doped semiconductor layer 310a and the growth substrate SUB are separated, may selectively perform a thinning process of first type doped semiconductor layer 310a (e.g., grinding or back etching), or to manufacture the photonic crystal on the first type doped semiconductor layer 310a.

Figure 8E:
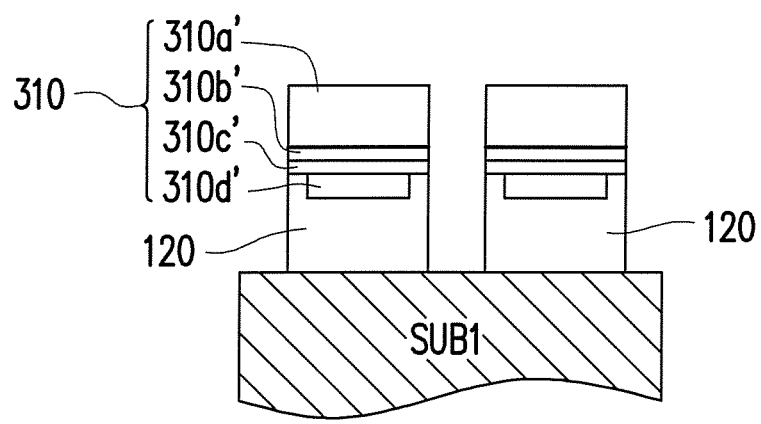

Referring to FIG. 8E, after the first type doped semiconductor layer 310a and the growth substrate SUB are separated, the first type semiconductor layer 310a, the light emitting layer 310b, the second type semiconductor layer 310c, and the sacrificial layer 120a are patterned, in order to form a plurality of first type semiconductor patterns 310a', a plurality of light-emitting patterns 310b', a plurality of second type semiconductor patterns 310c' and the sacrificial patterns 120. Herein, the first type semiconductor patterns 310a', the light-emitting patterns 310b', the second type semiconductor patterns 310c', and the electrodes 310d located on a same sacrificial pattern 120 constitute a device layer 310.

Figure 8F:
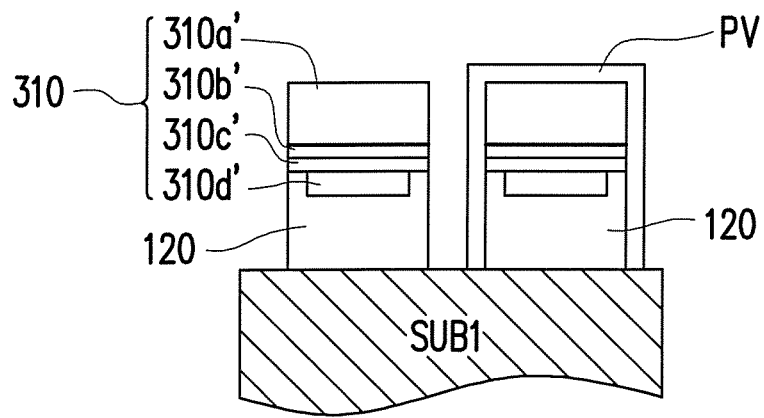

Referring to FIG. 8F, a protective layer PV is formed over the first substrate SUB1 to selectively cover parts of the device layers 310 and the sacrificial patterns 120, wherein parts of the device layers 310 and the sacrificial patterns 120 are uncovered by the protective layer PV. In the present embodiment, the protective layer PV is, for example, a photoresist material or other dielectric material, so as to ensure the device layers 310 covered by the protective layer PV are not to be separated from the first substrate SUB1 during a subsequent removal process of the sacrificial patterns 120. For example, a material of the protective layer PV may be a polyimide or other polymer material, and the material of the protective layer PV may also be a silicon oxide (SiOx), a silicon nitride (SiNx) or other inorganic dielectric material.

Figure 8G:
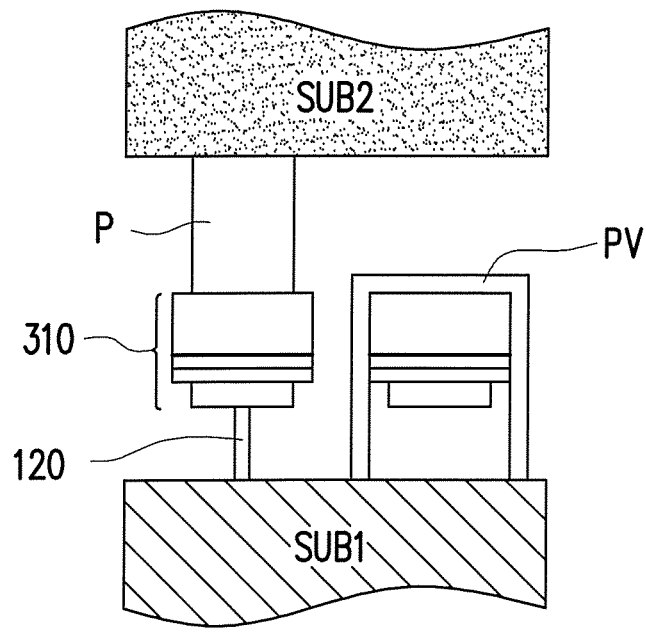

Referring to FIG. 8G, a second substrate SUB2 is provided, wherein the second substrate SUB2 is, for example, a stamp mold, and the stamp mold has a plurality of protrusions P. The protrusions P over the second substrate SUB2 are bonded with the device layers 310 uncovered by the protective layer PV. The sacrificial patterns 120 uncovered by the protective layer PV are removed, so as to transfer-bond parts of the device layers 310 to the stamp mold (SUB2).

Figure 8H:
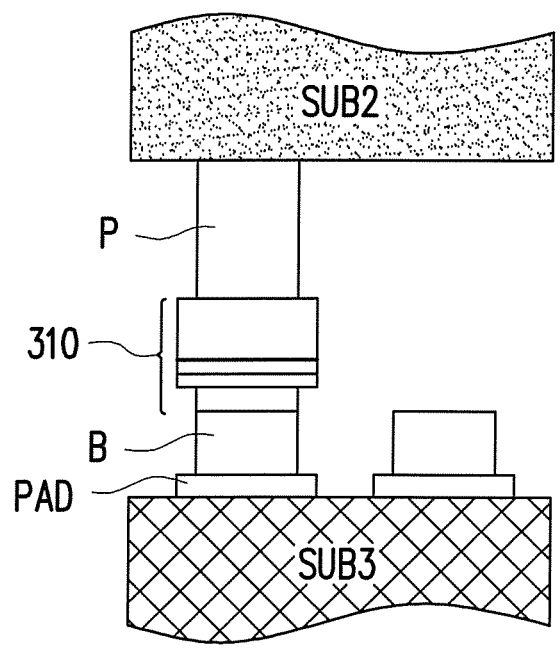

Referring to FIG. 8H, the device layers 310 transfer-bonded to the stamp mold (SUB2) are bonded with a circuit substrate SUB3 to further transfer-bond the device layers 310 to the circuit substrate SUB3, wherein the circuit substrate SUB3 is, for example, a circuit substrate (e.g., a complementary metal oxide semiconductor chip having a plurality of bonding pads PAD) in a monolithic micro-display. In the present embodiment, the device layers 310 are, for example, bonded the bonding pads PAD over the second substrate SUB2 through the conductive bumps B. For example, the conductive bumps B are gold bumps or other alloy bumps, and the bonding (electrical connection) between the conductive bumps B and the bonding pads PAD over the second substrate SUB2 are achieved through reflow or other soldering process.

Figure 8I:
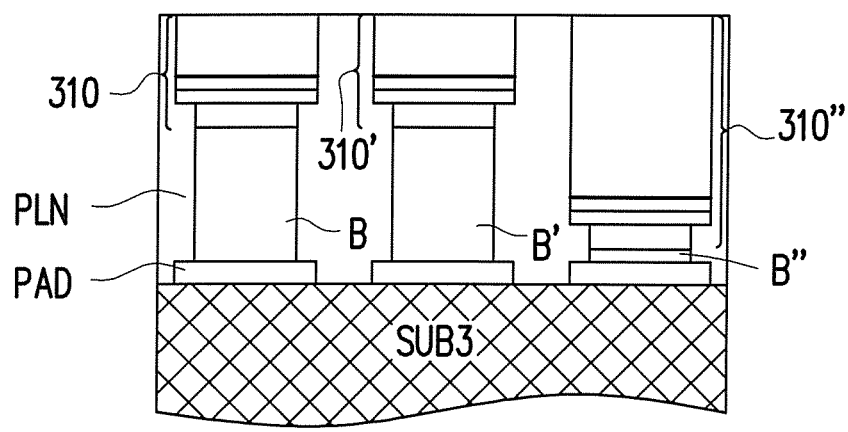

Referring to FIG. 8I, after firstly transfer-bonded the device layers 310 to the second substrate SUB2 and then to the circuit substrate SUB3, one of ordinary skill in the art may selectively repeat the aforementioned steps illustrated in FIG. 8A to FIG. 8H for at least once, so as to transfer-bond the device layers 310' and the device layers 310" to the circuit substrate SUB3.

As shown in FIG. 8H, since the device layers 310, 310', 310" capable of emitting different colored lights have different thicknesses, and the conductive bumps B, B', B" bonded with the device layers 310, 310', 310" also have different heights, top surfaces of the device layers 310, 310', 310" can be located on a same level of height. However, the present embodiment does not limit the top surfaces of the device layers 310, 310', 310" located on a same level of height, such that through adjusting the heights of the conductive bumps B, B', B", the top surfaces of the device layers 310, 310', 310" may be respectively located on different level of heights.

Figure 8J:
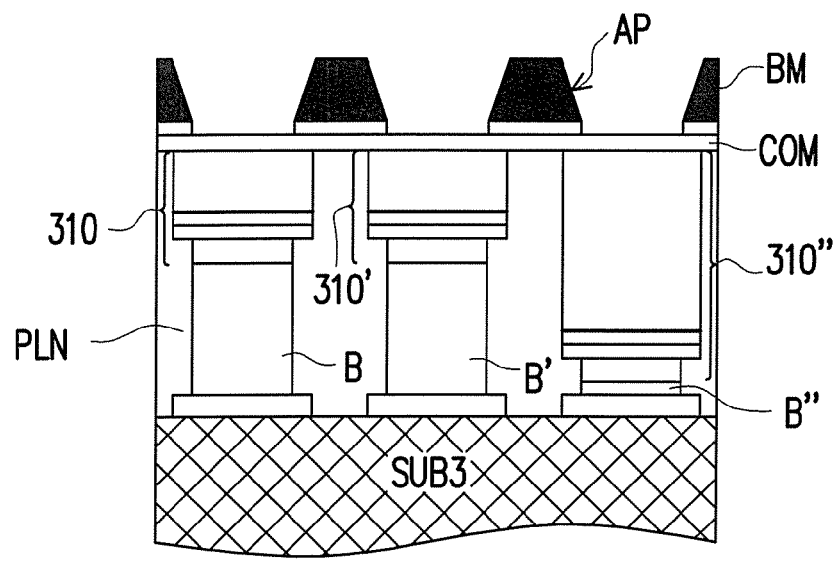
Figure 8K:
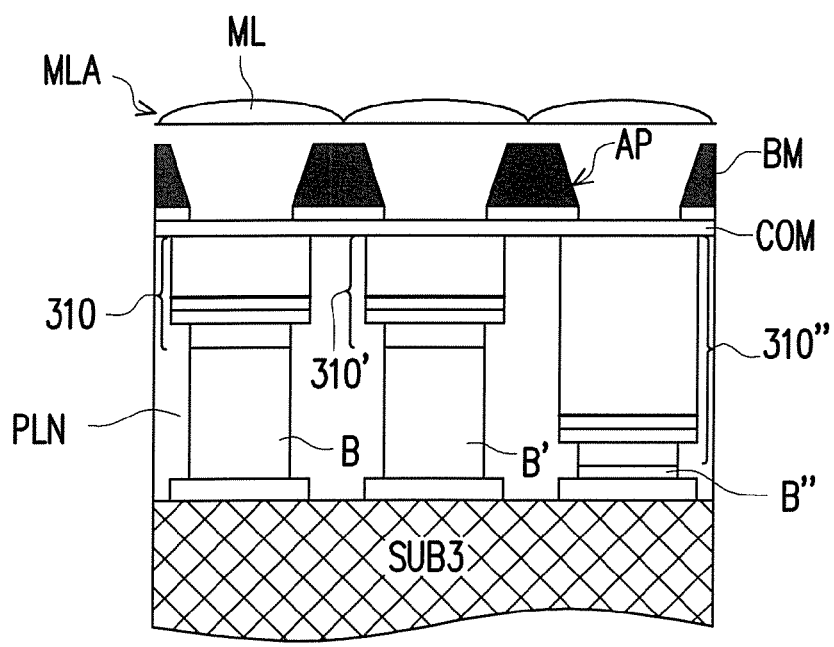

Since the manufacturing process illustrated in FIG. 8I to FIG. 8K is similar to the manufacturing process illustrated in FIG. 7I to FIG. 7K, the detail descriptions are not repeated herein.

According to the aforementioned embodiments, the light emitting devices may be rapidly and efficiently transfer-bonded from a substrate to another substrate, so as to facilitate an application of the light emitting devices in the field of micro-display.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting device array comprising:
   a circuit substrate having a plurality of bonding pads and a plurality of conductive bumps located over the bonding pads, wherein the plurality of conductive bumps comprises metal bumps or alloy bumps; and
   a plurality of device layers capable of emitting different colored lights electrically connected with the circuit substrate through the conductive bumps and the bonding pads, wherein the device layers capable of emitting different colored lights have different thicknesses, the conductive bumps bonded with the device layers capable of emitting different colored lights have different heights, such that top surfaces of the device layers capable of emitting different colored lights are located on a same level of height.

2. The light emitting device array as recited in claim 1, wherein the device layers comprise a plurality of first device layers capable of emitting a first light and a plurality of second device layers capable of emitting a second light different from the first light, the conductive bumps comprise a plurality of first conductive bumps connected to the first device layers and a plurality of second bumps connected to the second device layers, the thickness of the first device layers is smaller than the thickness of the second device layers, and the height of the first conductive bumps is greater than the height of the second conductive bumps.

3. The light emitting device array as recited in claim 2, wherein a sum of the thickness of the first device layers and the height of the first conductive bumps is substantially equal to a sum of the thickness of the second device layers and the height of the second conductive bumps.

4. The light emitting device array as recited in claim 1 further comprising:
   a planarized layer for encapsulating the device layers and the conductive bumps, wherein a surface of each device layers is exposed by the planarized layer and the planarized layer has a planar surface coplanar with the surfaces of the device layers exposed by the planarized layer.

5. The light emitting device array as recited in claim 4 further comprising:
   a common electrode located on the planar surface of the planarized layer and the surfaces of the device layers exposed by the planarized layer.

6. The light emitting device array as recited in claim 1 further comprising:
   a common electrode located on the device layers.

7. The light emitting device array as recited in claim 6 further comprising:
   a black matrix located on the common electrode, wherein the black matrix has a plurality of openings, and each of the openings is respectively located above one of the device layers.

8. The light emitting device array as recited in claim 1 further comprising:
   a micro-lens array comprising a plurality of micro-lenses arranged in array, wherein each of the micro-lenses is respectively located above one of the device layers.

9. The light emitting device array as recited in claim 1, wherein a lateral dimension of each of the conductive bumps is different to a lateral dimension of each of the device layers.

10. A light emitting device array comprising:
    a circuit substrate having a plurality of bonding pads and a plurality of conductive bumps located over the bonding pads; and
    a plurality of device layers capable of emitting different colored lights electrically connected with the circuit substrate through the conductive bumps and the bonding pads, wherein the device layers capable of emitting different colored lights have different thicknesses, the conductive bumps bonded with the device layers capable of emitting different colored lights have different heights, such that top surfaces of the device layers capable of emitting different colored lights are located on a same level of height;
    a planarized layer for encapsulating the device layers and the conductive bumps; and
    a common electrode located on the planarized layer and the device layers, wherein the common electrode completely covers and is electrically connected to a surface of each of the device layers that is exposed by the planarized layer.

11. The light emitting device array as recited in claim 10, wherein the planarized layer has a planar surface coplanar with the surfaces of the device layers exposed by the planarized layer and the planarized layer has a planar surface coplanar with the surfaces of the device layers exposed by the planarized layer.

12. The light emitting device array as recited in claim 10, wherein the device layers comprise a plurality of first device layers capable of emitting a first light and a plurality of second device layers capable of emitting a second light different from the first light, the conductive bumps comprise a plurality of first conductive bumps connected to the first device layers and a plurality of second bumps connected to the second device layers, the thickness of the first device layers is smaller than the thickness of the second device layers, and the height of the first conductive bumps is greater than the height of the second conductive bumps.

13. The light emitting device array as recited in claim 12, wherein a sum of the thickness of the first device layers and the height of the first conductive bumps is substantially equal to a sum of the thickness of the second device layers and the height of the second conductive bumps.

14. The light emitting device array as recited in claim 10 further comprising:
    a black matrix located on the common electrode, wherein the black matrix has a plurality of openings, and each of the openings is respectively located above one of the device layers.

15. The light emitting device array as recited in claim 10 further comprising:
a micro-lens array comprising a plurality of micro-lenses arranged in array, wherein each of the micro-lenses is respectively located above one of the device layers.

\* \* \* \* \*